United States Patent
Chen et al.

(10) Patent No.: US 9,531,337 B2
(45) Date of Patent: Dec. 27, 2016

(54) TRANSMITTER DIGITAL-TO-ANALOG CONVERTER (DAC)-BASEBAND FILTER (BBF) COMMON MODE INTERFACE

(71) Applicant: QUALCOMM Incorporated, San Diego, CA (US)

(72) Inventors: Minghui Chen, San Diego, CA (US); Mahim Ranjan, San Diego, CA (US); Jeremy Mark Goldblatt, San Diego, CA (US); Frederic Bossu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 78 days.

(21) Appl. No.: 14/602,697

(22) Filed: Jan. 22, 2015

(65) Prior Publication Data

US 2015/0349733 A1    Dec. 3, 2015

Related U.S. Application Data

(60) Provisional application No. 62/004,810, filed on May 29, 2014.

(51) Int. Cl.
| | |
|---|---|
| *H03F 3/45* | (2006.01) |
| *H03M 1/06* | (2006.01) |
| *H02M 1/12* | (2006.01) |
| *H03M 1/66* | (2006.01) |

(52) U.S. Cl.
CPC ...... *H03F 3/45479* (2013.01); *H03F 3/45475* (2013.01); *H03F 3/45556* (2013.01); *H03M 1/0607* (2013.01); *H02M 2001/123* (2013.01); *H03F 2203/45078* (2013.01); *H03F 2203/45418* (2013.01); *H03F 2203/45424* (2013.01); *H03F 2203/45526* (2013.01); *H03M 1/66* (2013.01)

(58) Field of Classification Search
CPC ........................................................ H03F 3/45
USPC .................................................... 330/258, 69
See application file for complete search history.

(56) References Cited

U.S. PATENT DOCUMENTS

| | | | |
|---|---|---|---|
| 5,187,448 A * | 2/1993 | Brooks ............... | H03F 3/45183 330/253 |
| 5,629,641 A | 5/1997 | Cheng | |
| 5,668,468 A * | 9/1997 | Cargill .................... | G05F 3/242 323/316 |
| 6,317,068 B1 | 11/2001 | Gattani et al. | |
| 6,417,728 B1 * | 7/2002 | Baschirotto ......... | H03F 3/45183 330/258 |

(Continued)

OTHER PUBLICATIONS

International Search Report and Written Opinion issued in PCT/US2015/032207 on Jul. 21, 2015—ISA/EPO (12 pages).

*Primary Examiner* — Patricia T Nguyen
(74) *Attorney, Agent, or Firm* — Procopio, Cory, Hargreaves & Savitch, LLP

(57) ABSTRACT

Removing common-mode current from a pair of complementary current signals, including: generating a common-mode voltage of the pair of complementary current signals including at least a first current signal and a second current signal; measuring and outputting a difference voltage between the generated common-mode voltage and a common-mode reference voltage; and removing at least a portion of the common-mode current from the first current signal and the second current signal based on the difference voltage.

20 Claims, 4 Drawing Sheets

(56) References Cited

U.S. PATENT DOCUMENTS

| | | | |
|---|---|---|---|
| 7,705,671 B1* | 4/2010 | Bapat | H03F 3/45475 |
| | | | 330/10 |
| 7,884,672 B1* | 2/2011 | Cetin | H03F 3/45183 |
| | | | 330/254 |
| 8,624,688 B2 | 1/2014 | Essenwanger | |
| 8,861,641 B2 | 10/2014 | Oka et al. | |
| 2005/0242874 A1* | 11/2005 | Lind | H03F 3/217 |
| | | | 330/10 |
| 2009/0058527 A1 | 3/2009 | Srinivasa et al. | |
| 2009/0224735 A1 | 9/2009 | Tsutsumi et al. | |
| 2014/0036976 A1 | 2/2014 | Shad | |
| 2014/0142447 A1 | 5/2014 | Takahashi et al. | |
| 2014/0161208 A1 | 6/2014 | Lim et al. | |
| 2014/0300415 A1* | 10/2014 | Casiraghi | G01P 15/0802 |
| | | | 330/260 |

\* cited by examiner

FIG. 3A
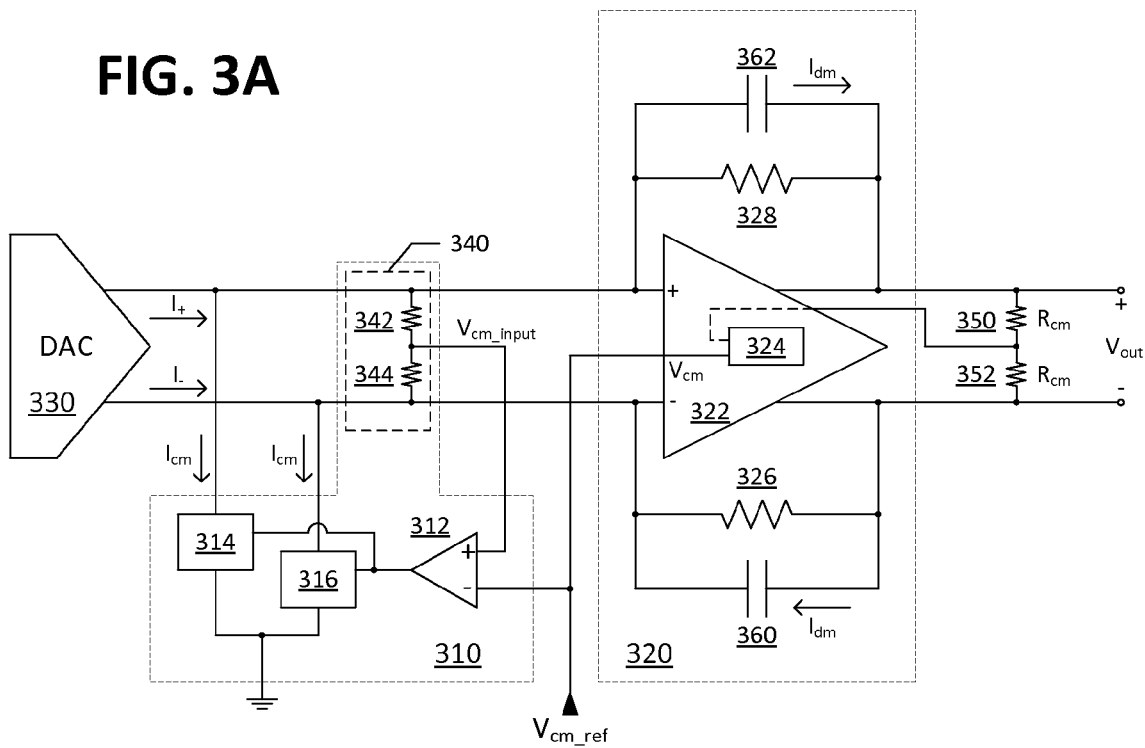
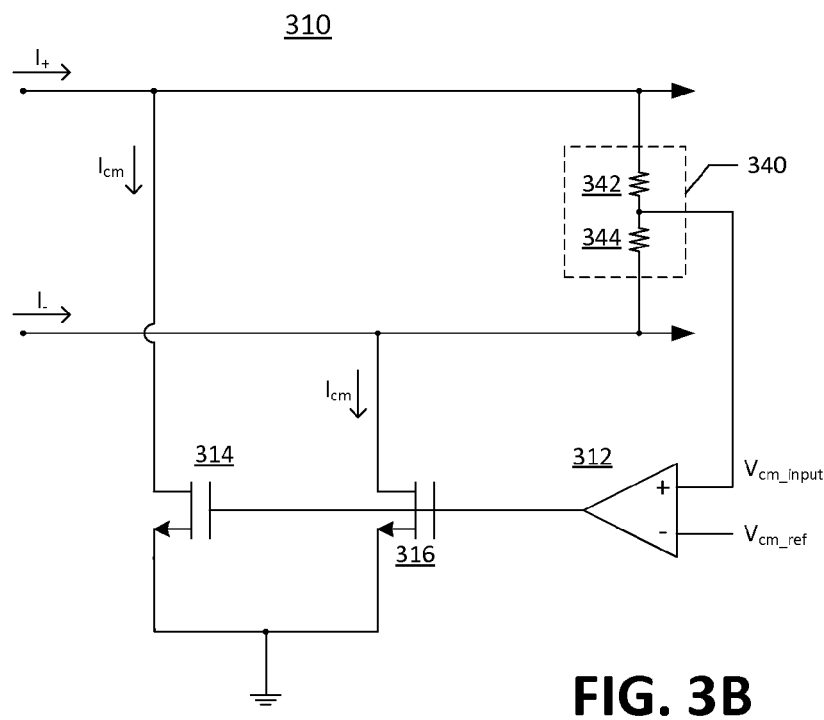
FIG. 3B

… (1,337 B2)

TRANSMITTER DIGITAL-TO-ANALOG CONVERTER (DAC)-BASEBAND FILTER (BBF) COMMON MODE INTERFACE

CROSS-REFERENCE TO RELATED APPLICATIONS

This application claims the benefit of priority under 35 U.S.C. §119(e) of U.S. Provisional Patent Application No. 62/004,810, filed May 29, 2014, entitled "Transmitter Digital-to-Analog Converter (DAC)-Baseband Filter (BBF) Common Mode Interface." The disclosure of the above-referenced application is incorporated herein by reference.

BACKGROUND

Field

This disclosure relates generally to interfaces, and more specifically, to a transmitter digital-to-analog converter (DAC)-baseband filter (BBF) common mode interface.

Background

High-speed digital-to-analog converters (DACs) are commonly implemented with a complementary current signal. In one case, a transmitter DAC can be configured to feed a transmitter analog baseband filter (BBF) with a complementary current ranging from 0 mA to 2 mA (or 0.4 mA to 2.4 mA) in full scale. The complementary current includes common-mode current and differential-mode current. However, it is desirable to prevent the common-mode current from flowing into the BBF.

SUMMARY

The present disclosure provides for removing the common-mode current from the DAC complementary current signal and maintaining proper operational amplifier input bias voltage and linearity.

In one embodiment, a circuit for removing common-mode current from a pair of complementary current signals is disclosed. The circuit includes: a generator unit configured to generate a common-mode voltage of the pair of complementary current signals including at least a first current signal and a second current signal; and a measurement unit configured to measure and output a difference voltage configured to remove the common-mode current from the first current signal and the second current signal, wherein the difference voltage is based on a difference between the common-mode voltage generated by the generator unit and a common-mode reference voltage.

In another embodiment, a method for removing common-mode current from a pair of complementary current signals is disclosed. The method includes: generating a common-mode voltage of the pair of complementary current signals comprising at least a first current signal and a second current signal; measuring and outputting a difference voltage between the generated common-mode voltage and a common-mode reference voltage; and removing at least a portion of the common-mode current from the first current signal and the second current signal based on the difference voltage.

In another embodiment, an apparatus for removing common-mode current from a pair of complementary current signals is disclosed. The apparatus includes: means for generating a common-mode voltage of the pair of complementary current signals comprising at least a first current signal and a second current signal; means for measuring and outputting a difference voltage between the generated common-mode voltage and a common-mode reference voltage; and means for removing the common-mode current from the first current signal and the second current signal based on the difference voltage.

In yet another embodiment, a circuit for removing common-mode current from a pair of complementary current signals received from a digital-to-analog converter (DAC) and sent to a baseband filter (BBF) of a transmitter is disclosed. The circuit includes: a first node to receive a first current signal of the pair of complementary current signals from the DAC, the first node coupled to a positive terminal of an operational amplifier in the BBF; a second node to receive a second current signal of the pair of complementary current signals from the DAC, the second node coupled to a negative terminal of the operational amplifier in the BBF; a first resistor coupled to the first node to remove the common-mode current from the first current signal; and a second resistor coupled to the second node to remove the common-mode current from the second current signal.

Other features and advantages of the present disclosure should be apparent from the present description which illustrates, by way of example, aspects of the disclosure.

BRIEF DESCRIPTION OF THE DRAWINGS

The details of the present disclosure, both as to its structure and operation, may be gleaned in part by study of the appended further drawings, in which like reference numerals refer to like parts, and in which:

FIG. 3A is a detailed schematic diagram of a common-mode current removing unit coupled to a baseband filter (BBF) receiving complementary DAC currents from a DAC in accordance with one embodiment of the present disclosure;

FIG. 3B is a detailed schematic diagram of a common-mode current removing unit in accordance with one embodiment of the present disclosure.

DETAILED DESCRIPTION

Since the range of the complementary output currents of a digital-to-analog converter (DAC) is variable, the output currents can be used for controlling the gain of a transmitter signal path. As described above, the complementary DAC currents (I+/I− or Q+/Q−) include common-mode currents and differential-mode currents which can be expressed as follows:

$$I_+ = I_{cm} + I_{dm} \quad (1)$$

$$I_- = I_{cm} - I_{dm} \quad (2)$$

$$Q_+ = Q_{cm} + Q_{dm} \quad (3)$$

$$Q_- = Q_{cm} - Q_{dm} \quad (4)$$

Further, the differential-mode currents flow into the baseband filter (BBF) and produce useful signal voltages since these currents carry modulation information. However, the common-mode currents flowing into the BBF feedback resistors may cause the input common-mode voltage to differ from the output common-mode voltage. Accordingly, it is desirable to prevent the DAC common-mode currents from flowing into the BBF and potentially causing high voltage at the BBF input.

Several embodiments as described herein provide for removing the common-mode currents from the DAC complementary current signal and maintaining proper operational amplifier input bias voltage and linearity. After reading this description it will become apparent how to implement the disclosure in various implementations and applications. Although various implementations of the present disclosure will be described herein, it is understood that these implementations are presented by way of example only, and not limitation. As such, this detailed description of various implementations should not be construed to limit the scope or breadth of the present disclosure.

Figure 1:
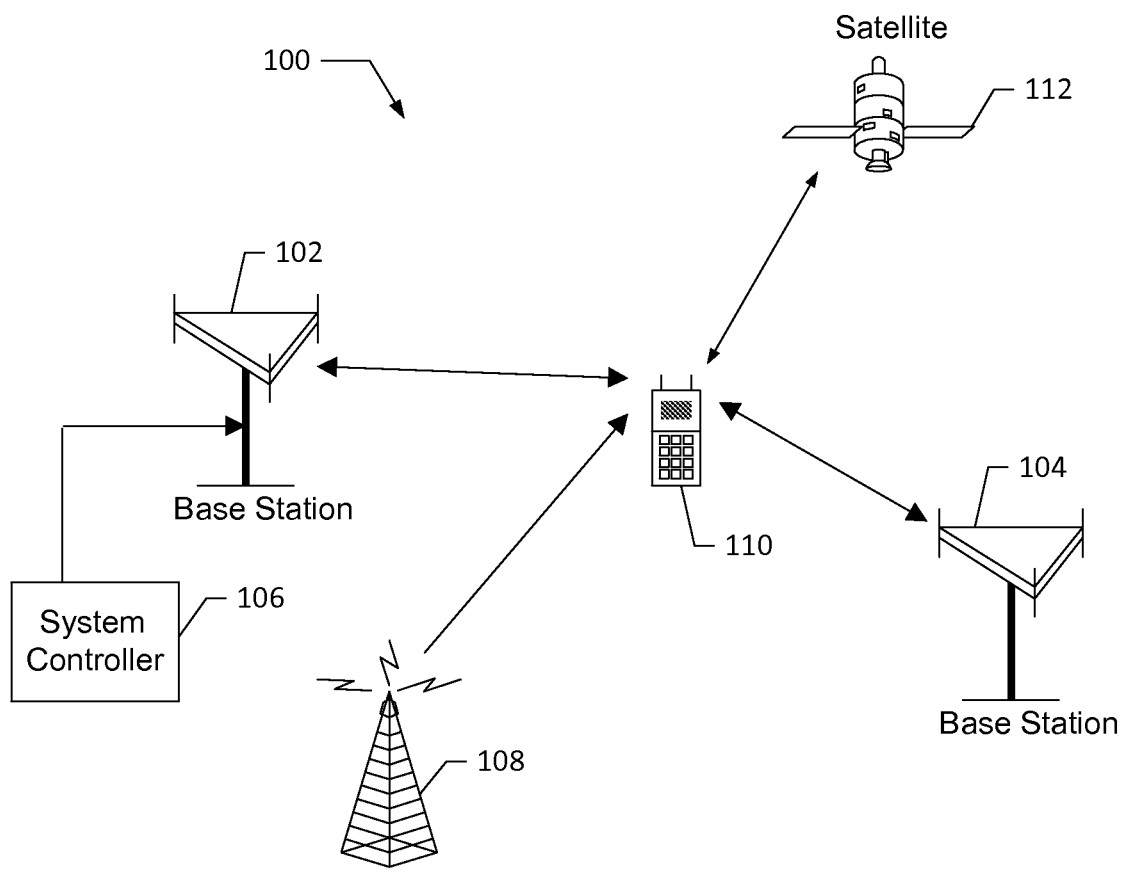
FIG. 1 is an exemplary wireless device communicating with a wireless communication system.

FIG. 1 is an exemplary wireless device 110 communicating with a wireless communication system 100. The wireless system 100 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1x, Evolution-Data Optimized (EVDO), Time Division Synchronous CDMA (TD-SCDMA), or some other version of CDMA. For simplicity, FIG. 1A shows wireless system 100 including two base stations 102 and 104 and one system controller 106. In general, a wireless system may include any number of base stations and any set of network entities.

The wireless device 110 may also be referred to as a user equipment (UE), a mobile station, a terminal, an access terminal, a subscriber unit, a station, etc. The wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. The wireless device 110 may communicate with a wireless system 100. The wireless device 110 may also receive signals from broadcast stations (e.g., a broadcast station 108), signals from satellites (e.g., a satellite 112) in one or more global navigation satellite systems (GNSS), etc. The wireless device 110 may support one or more radio technologies for wireless communication such as LTE, WCDMA, CDMA 1x, EVDO, TD-SCDMA, GSM, 802.11, etc.

Figure 2:
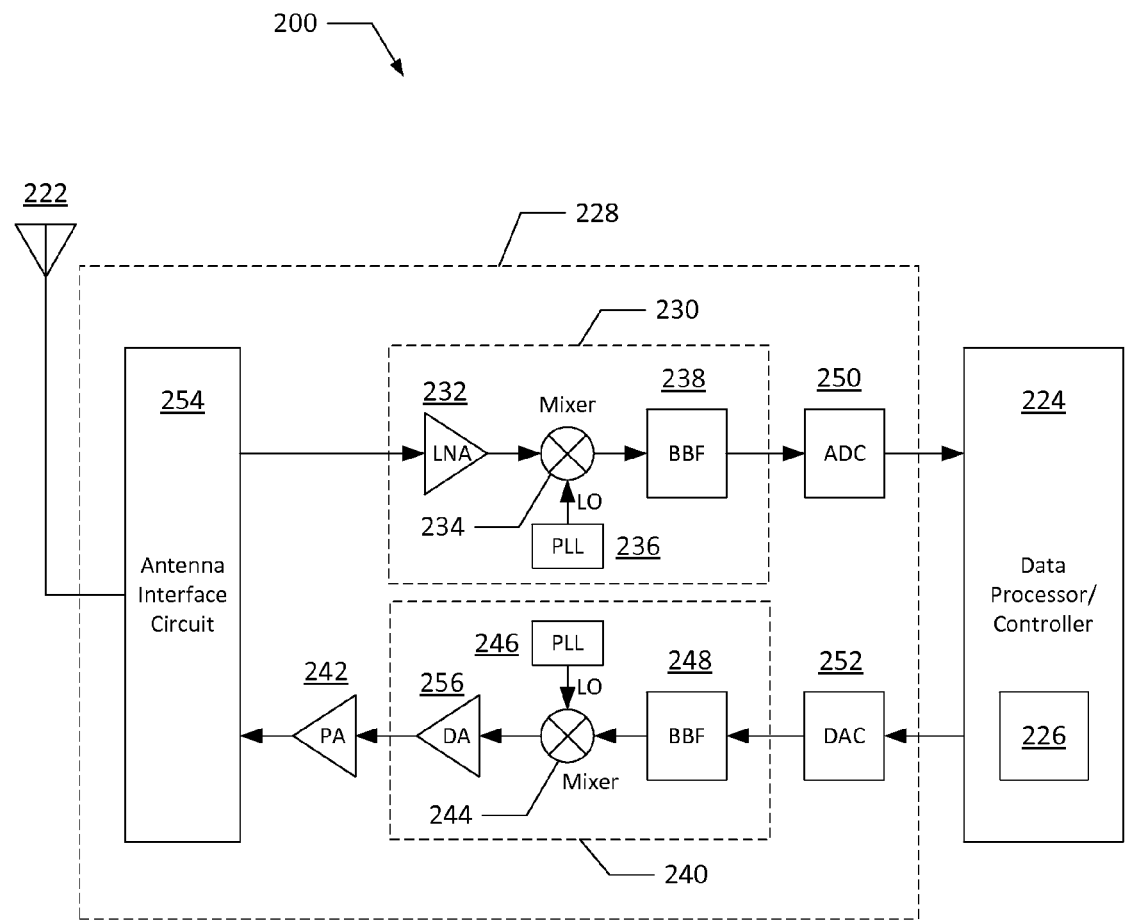
FIG. 2 is a block diagram of an exemplary design of a wireless device that is one embodiment of a wireless device of FIG. 1.

FIG. 2 is a block diagram of an exemplary design of a wireless device 200 that is one embodiment of a wireless device 110 of FIG. 1. In this exemplary design, the wireless device 200 includes a transceiver 228 coupled to an antenna 222, and a data processor/controller 224. The transceiver 228 includes antenna interface circuit 254, a receiver path 230, and a transmitter path 240. Antenna interface circuit 254 may include switches, duplexers, transmit filters, receive filters, matching circuits, etc. The data processor/controller 224 may perform various functions for the wireless device 200. For example, the data processor/controller 224 may perform processing for data being received via the receiver path 230 and data being transmitted via the transmitter path 240. The data processor/controller 224 may control the operation of various circuits within the transceiver 228. Memory 226 may store program codes and data for the data processor/controller 224. The data processor/controller 224 may be implemented on one or more application specific integrated circuits (ASICs) and/or other ICs.

The receiver path 230 includes a low noise amplifier (LNA) 232, a mixer 234, a phase locked loop (PLL) 236, and a baseband filter 238. An analog-to-digital converter (ADC) 250 is placed subsequent to the baseband filter 238 to digitize the baseband signal. The transmitter path 240 includes a baseband filter 248, a PLL 246, a mixer 244, a driver amplifier (DA) 256, and a power amplifier (PA) 242. A digital-to-analog converter (DAC) 252 is placed between the data processor/controller 224 and the baseband filter 248 to convert the digital data to the analog baseband signal. In the illustrated embodiment of FIG. 2, the receiver path 230 includes PLL 236 and the transmitter path 240 includes PLL 246 to provide local oscillator signals to the mixer 234, 244. However, in other embodiments, both receiver path 230 and transmitter path 240 can use a single common PLL. In one embodiment, the baseband filters 238, 248 are low-pass filters.

For data reception, antenna 222 receives signals from base stations and/or other transmitter stations and provides a received radio frequency (RF) signal, which is routed through an antenna interface circuit 254 and presented as an input RF signal to the receiver path 230. Within the receiver path 230, the LNA 232 amplifies the input RF signal and provides an output RF signal to the mixer 234. The PLL 236 generates a local oscillator signal. The mixer 234 mixes the output RF signal with the PLL-generated local oscillator signal to downconvert the output RF signal from RF to baseband. The baseband filter 238 filters the downconverted signal to provide an analog input signal to the ADC 250, which converts the analog input signal to the digital data and provides the digital data to the data processor/controller 224. The receiver path 230 may include other elements such as matching circuits, an oscillator, etc.

For data transmission, the data processor/controller 224 processes (e.g., encodes and modulates) data to be transmitted and provides a digital data to the DAC 252, which converts the digital data to an analog output signal and provides the converted analog output signal to the transmitter path 240. Within the transmitter path 240, the baseband filter 248 amplifies and filters the analog output signal. The PLL 246 generates a local oscillator signal. The mixer 244 mixes the filtered analog output signal with the PLL-generated local oscillator signal to upconvert the filtered analog output signal from baseband to RF and provide a modulated RF signal. The transmitter path 240 may include other elements such as matching circuits, an oscillator, etc. The DA 256 and PA 242 receives and amplifies the modulated RF signal and provides a transmit RF signal having the proper output power level. The transmit RF signal is routed through antenna interface circuit 254 and transmitted via antenna 222.

FIG. 3A is a detailed schematic diagram of a common-mode current removing unit 310 coupled to a baseband filter (BBF) 320 receiving complementary DAC currents from a DAC 330 in accordance with one embodiment of the present disclosure. In the illustrated embodiment of FIG. 3A, the diagram includes a DAC 330, a BBF 320, and a common-mode current removing unit 310. In operation, the DAC 330 supplies the complementary currents (e.g., $I_+$ and $I_-$), each of which includes common-mode current ($I_{cm}$) and differential-mode current ($I_{dm}$) (see equations (1) and (2) shown above). The BBF 320 includes an op amp 322, feedback resistors 326, 328, and feedback capacitors 360, 362. The op amp 322 includes an embedded common mode feedback sensor 324 which measures the difference between the output common-mode voltage (provided by common mode resistors 350, 352 each having value $R_{cm}$) and the common-mode reference voltage ($V_{cm\_ref}$).

In the illustrated embodiment of FIG. 3A, the common-mode current removing unit 310 is configured to remove the common-mode current from each of the complementary DAC currents (e.g., $I_+$ and $I_-$). The common-mode current removing unit 310 includes a generator unit 340, a pair of current removing units 314, 316, and a measurement unit configured with an operational amplifier (op amp) 312. In one embodiment shown in FIG. 3A, the generator unit 340 includes a pair of resistors 342, 344 which are configured to generate a common-mode voltage of the pair of complementary current signals. In operation, op amp 312 measures the difference between the input common-mode voltage ($V_{cm\_input}$) provided at the positive input terminal of op amp 312 by common mode resistors 342, 344 (each having value $R_{cm}$) and the common-mode reference voltage ($V_{cm\_ref}$) provided at the negative input terminal of op amp 312. Op amp 312 then drives the pair of current removing units 314, 316 to remove or sink the common-mode current ($I_{cm}$) from each of the complementary DAC currents $I_+$ and $I_-$, respectively.

In one embodiment, the common-mode current removing unit 310 can be generalized as a circuit for removing common-mode current from a pair of complementary current signals, which includes a generator unit 340, a pair of first and second current removing units 314, 316, and a measurement unit 312. The generator unit 340 is configured to generate a common-mode voltage of the pair of complementary current signals (including first ($I_+$) and second ($I_-$) current signal) input to a filter (e.g. BBF 320). The measurement unit 312 is configured to measure and output a difference signal between the common-mode voltage ($V_{cm\_input}$) generated by the generator unit 340 and a common-mode reference voltage ($V_{cm\_ref}$). The difference signal at the output of the measurement unit 312 drives the first current removing unit 314 to remove the common-mode current from the first current signal ($I_+$) and drives the second current removing unit 316 to remove the common-mode current from the second current signal ($I_-$).

FIG. 3B is a detailed schematic diagram of a common-mode current removing unit 310 in accordance with one embodiment of the present disclosure. In the illustrated embodiment of FIG. 3B, the generator unit 340 including resistors 342, 344 generates a common-mode input voltage ($V_{cm\_input}$) of the pair of complementary current signals ($I_+$ and $I_-$). In other embodiments, the generator unit 340 is configured with elements other than resistors such as field-effect transistor (FET) resistors, inductors, or capacitors. The measurement unit configured as an op amp 312 measures the difference between the input common-mode voltage ($V_{cm\_input}$) and the common-mode reference voltage ($V_{cm\_ref}$). In an alternative embodiment, the op amp 312 can be replaced with any element(s) that is capable of measuring the difference between the input common-mode voltage and common-mode reference voltage. Thus, in one example, a transistor-based comparator can be used to measure the difference.

In FIG. 3B, the op amp 312 drives the field-effect transistors 314 and 316 to remove or sink the common-mode current ($I_{cm}$) from each of the complementary current signals $I_+$ and $I_-$, respectively. Thus, by driving the gates of the transistors 314, 316 with a difference signal between the common-mode voltage on the complementary signal lines and the common-mode reference voltage, the current removed by the transistors 314, 316 is proportional to the difference signal. Accordingly, the amount of current removed is substantially equal to the common-mode current ($I_{cm}$) in the complementary current signals.

Figure 4:
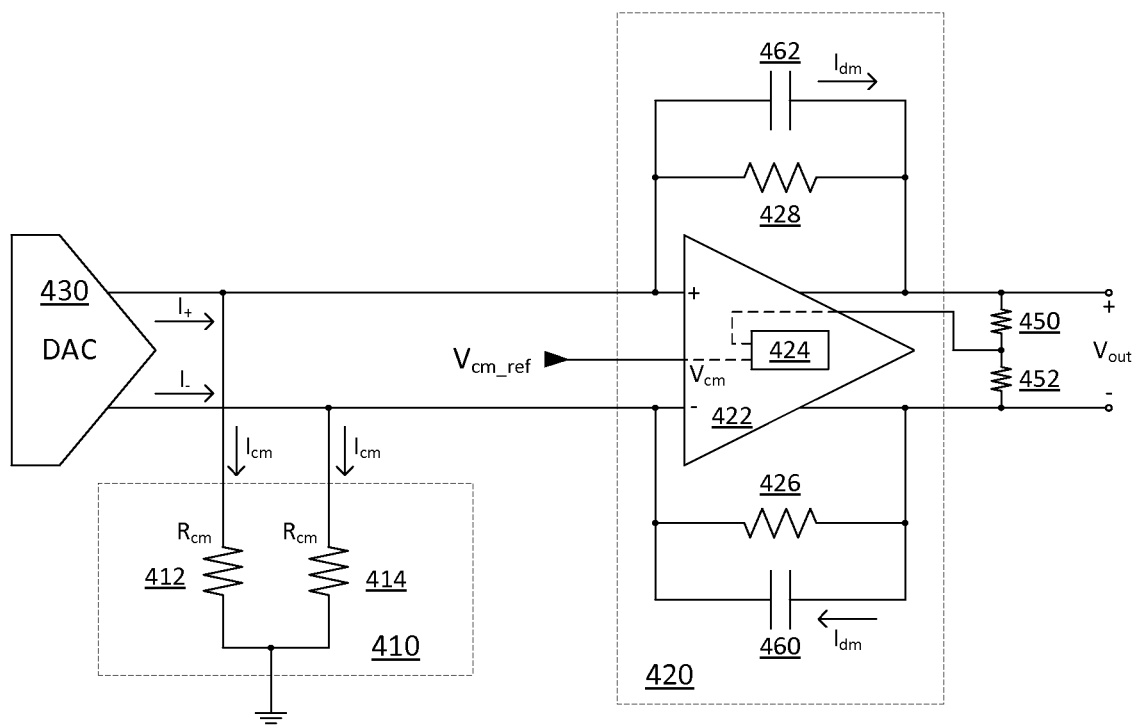
FIG. 4 is a detailed schematic diagram of a common-mode current removing unit coupled to a baseband filter (BBF) receiving complementary DAC currents from a DAC in accordance with another embodiment of the present disclosure.

FIG. 4 is a detailed schematic diagram of a common-mode current removing unit 410 coupled to a baseband filter (BBF) 420 receiving complementary DAC currents from a DAC 430 in accordance with another embodiment of the present disclosure. In the illustrated embodiment of FIG. 4, the diagram includes a DAC 430, a BBF 420, and a common-mode current removing unit 410. The DAC 430 supplies the complementary currents (e.g., $I_+$ and $I_-$), each of which includes common-mode current and differential-mode current (see equations (1) and (2)). The BBF 420 includes an op amp 422, feedback resistors 426, 428, and feedback capacitors 460, 462. The op amp 422 includes an embedded common mode feedback sensor 424 which measures the difference between the output common-mode voltage (provided by common mode resistors 450, 452 each having value $R_{cm}$) and the common-mode reference voltage ($V_{cm\_ref}$).

In the illustrated embodiment of FIG. 4, the common-mode current removing unit 410 is configured to remove the common-mode current from each of the complementary DAC currents (e.g., $I_+$ and $I_-$). In the common-mode current removing unit 410, two resistors 212 and 214 (each having same value $R_{cm}$) are configured to remove or sink the common-mode current ($I_{cm}$) from each of the complementary DAC currents $I_+$ and $I_-$, respectively. Therefore, resistor 412 is configured to sink common-mode current $I_{cm}$ from DAC current $I_+$, while resistor 414 is configured to sink common-mode current $I_{cm}$ from DAC current $I_-$. The values of the resistors 412, 414 are selected based on the common-mode reference voltage to draw the desired amount of common-mode current from the DAC current.

The configuration of the common-mode current removing unit 310, 410 as described above provides several advantages. For example, the configuration provides flexible DAC output current range, keeps ideal bias voltage for the op amp of the baseband filter, saves transmitter signal path current in the presence of high DAC common-mode DC current, tolerates large DAC current variation for transmitter gain control, and improves harmonic distortion in the filter.

Although several embodiments of the disclosure are described above, many variations of the disclosure are possible. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the disclosure. In addition, the grouping of functions within a module, block, or step is for ease of description. Specific functions or steps can be moved from one module or block without departing from the disclosure.

The various illustrative logical blocks, units, steps, components, and modules described in connection with the embodiments disclosed herein can be implemented or performed with a processor, such as a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor can be a microprocessor, but in the alternative, the processor can be any processor, controller, microcontroller, or state machine. A processor can also be implemented as a combination of computing devices, for example, a combination of a DSP and a microprocessor, a plurality of microprocessors, one or more microprocessors in conjunction with a DSP core, or any other such configuration. Further, circuits implementing the embodiments and functional blocks and modules described herein can be realized using various transistor types, logic families, and design methodologies.

The above description of the disclosed embodiments is provided to enable any person skilled in the art to make or use the disclosure. Various modifications to these embodiments will be readily apparent to those skilled in the art, and the generic principles described herein can be applied to other embodiments without departing from the spirit or scope of the disclosure. Thus, it is to be understood that the description and drawings presented herein represent presently preferred embodiments of the disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

What is claimed is:

1. An interface circuit of a transmitter for removing common-mode current from a pair of complementary current signals from a digital-to-analog converter (DAC), the circuit comprising:
    a generator unit configured to generate a common-mode voltage of the pair of complementary current signals comprising at least a first current signal and a second current signal;
    a measurement unit configured to measure and output a difference voltage; and
    first and second current removing units directly coupled to an output of the DAC of the transmitter, the first and second current removing units configured to receive a respective one of the first current signal and the second current signal output from the DAC;
    wherein the difference voltage is based on a difference between the common-mode voltage generated by the generator unit and a common-mode reference voltage.

2. The circuit of claim 1,
    wherein the first and second current removing units are configured to remove the common-mode current from the first current signal and the second current signal output from the DAC;
    wherein the difference voltage of the measurement unit is configured to drive the first current removing unit to remove the common-mode current from the first current signal, and drive the second current removing unit to remove the common-mode current from the second current signal.

3. The circuit of claim 2, wherein the first and second current removing units comprise first and second transistors.

4. The circuit of claim 3, wherein the measurement unit comprises an operational amplifier.

5. The circuit of claim 4, wherein an output of the operational amplifier is coupled to gate terminals of the first and second transistors.

6. The circuit of claim 1, wherein the generator unit comprises a pair of resistors connected in series of the pair of complementary current signals.

7. The circuit of claim 6, wherein the generated common-mode voltage is tapped from a node disposed between the pair of resistors.

8. The circuit of claim 1, wherein the measurement unit comprises an operational amplifier configured to receive the generated common-mode voltage at a first input terminal and the common-mode reference voltage at a second input terminal, and output the difference voltage.

9. The circuit of claim 8, the first input terminal comprises a positive terminal and the second input terminal comprises a negative terminal.

10. The circuit of claim 1, wherein the pair of complementary current signals is an output from a digital-to-analog converter (DAC) and is an input to a baseband filter.

11. A method for removing common-mode current from a pair of complementary current signals from a DAC in a transmitter, the method comprising:
    generating a common-mode voltage of the pair of complementary current signals comprising at least a first current signal and a second current signal output from the DAC of the transmitter;
    measuring and outputting a difference voltage between the generated common-mode voltage and a common-mode reference voltage; and
    removing at least a portion of the common-mode current from the first current signal and the second current signal directly from an output of DAC based on the difference voltage.

12. The method of claim 11, wherein the removing at least a portion of the common-mode current from the first current signal and the second current signal comprises:
    driving a first current removing unit to remove the common-mode current from the first current signal using the difference voltage; and
    driving a second current removing unit to remove the common-mode current from the second current signal using the difference voltage.

13. The method of claim 12, wherein the first current removing unit comprises a first transistor and the second current removing unit comprises a second transistor.

14. The method of claim 11, wherein generating a common-mode voltage comprises:
    connecting a pair of resistors in series to the pair of complementary current signals; and
    tapping from a node disposed between the pair of resistors to output the common-mode voltage.

15. The method of claim 11, wherein measuring and outputting a difference voltage comprises:
    receiving the generated common-mode voltage at a first input of an operational amplifier;
    receiving the common-mode reference voltage at a second input of the operational amplifier; and
    outputting the difference voltage at an output of the operational amplifier.

16. An apparatus for a transmitter for removing common-mode current from a pair of complementary current signals from a DAC, the apparatus comprising:
    means for generating a common-mode voltage of the pair of complementary current signals comprising at least a first current signal and a second current signal output from the DAC of the transmitter;

means for measuring and outputting a difference voltage between the generated common-mode voltage and a common-mode reference voltage; and means for removing the common-mode current from the first current signal and the second current signal directly from an output of the DAC based on the difference voltage.

17. The apparatus of claim 16, wherein the means for removing the common-mode current comprises:

means for driving a first current removing unit to remove the common-mode current from the first current signal using the difference voltage; and means for driving a second current removing unit to remove the common-mode current from the second current signal using the difference voltage.

18. The apparatus of claim 16, wherein means for generating a common-mode voltage comprises:

means for connecting a pair of resistors in series to the pair of complementary current signals; and means for tapping from a node disposed between the pair of resistors to output the common-mode voltage.

19. The apparatus of claim 16, wherein means for measuring and outputting a difference voltage comprises:

means for receiving the generated common-mode voltage at a first input of an operational amplifier;

means for receiving the common-mode reference voltage at a second input of the operational amplifier; and means for outputting the difference voltage at an output of the operational amplifier.

20. An interface circuit of a transmitter for removing common-mode current from a pair of complementary current signals received from a digital-to-analog converter (DAC) and sent to a baseband filter (BBF) of a transmitter, the circuit comprising:

a first node configured to receive a first current signal of the pair of complementary current signals from the DAC, the first node coupled to a positive terminal of a first operational amplifier in the BBF;

a second node configured to receive a second current signal of the pair of complementary current signals from the DAC, the second node coupled to a negative terminal of the first operational amplifier in the BBF;

first and second resistors coupled in series across the first node the second node;

a third node disposed between the first and second resistors and outputting a common mode voltage;

a second operational amplifier configured to receive the common mode voltage and a common-mode reference voltage, and output a difference voltage at an output terminal;

first and second transistors, wherein drain terminals of the first and second transistors are coupled to the first and second nodes, respectively, and wherein gate terminals of the first and second transistors are connected to the output terminal of the second operational amplifier.

* * * * *